United States Patent
Pfefferl et al.

[19]

[11] Patent Number: 6,078,534
[45] Date of Patent: Jun. 20, 2000

[54] SEMICONDUCTOR MEMORY HAVING REDUNDANCY CIRCUIT

[75] Inventors: Karl-Peter Pfefferl, Hohenkirchen, Germany; Martin Gall, South Burlington, Vt.

[73] Assignee: Siemens Aktiengesellschaft, Munich, Germany

[21] Appl. No.: 08/937,570

[22] Filed: Sep. 25, 1997

[51] Int. Cl.[7] .................................................. G11C 7/00
[52] U.S. Cl. ...................................... 365/200; 365/230.01
[58] Field of Search ................................ 365/200, 230.01

[56] References Cited

U.S. PATENT DOCUMENTS

| | | | |
|---|---|---|---|
| 3,940,740 | 2/1976 | Coontz | 340/166 R |
| 4,514,830 | 4/1985 | Hagiwara et al. | 365/200 |
| 4,656,609 | 4/1987 | Higuchi et al. | 365/200 |
| 5,046,046 | 9/1991 | Sweha et al. | 365/200 |
| 5,381,370 | 1/1995 | Lacey et al. | 365/200 |
| 5,652,725 | 7/1997 | Suma et al. | 365/200 |
| 5,808,948 | 9/1998 | Kim et al. | 365/200 |
| 5,841,709 | 11/1998 | McClure | 365/200 |

OTHER PUBLICATIONS

Betty Prince, "Semiconductor Memories", pp.: 541, 542, 555, 556, 569–571, and 618–620, 1996.

"Fuseless Non–Volatile Ferroelectric Redundant Word and Bit Decoder", IBM Technical Disclosure Bulletin, vol. 34, No. 7B, Dec. 1, 1991, pp. 138–140.

*Primary Examiner*—Trong Phan
*Assistant Examiner*—M. Tran
*Attorney, Agent, or Firm*—Stanton C. Braden

[57] ABSTRACT

A memory having an array of memory cells. The array includes a plurality of normal memory cells and a redundant memory cell. A decoder is provided for selecting an addressed one of the normal memory cells in response to an address and a normal condition signal and adapted address the redundant memory cell in response to the address and a fault condition signal. A redundant decoder is provided having an electronically erasable read-only-memory cell. The redundant decoder is adapted to produce the normal condition signal and to convert the normal condition signal into the fault condition signal when such read-only-memory cell is programmed into a fault condition. Each one of the read-only memory cells include a flash memory cell, a ferroelectric memory cell, or other such type of electronically erasable read-only memory cell which is substantially non-volatile and is able to retain its programmed state for a relatively long period of time. With such an arrangement, because the electronically erasable read-only-memory cell is electronically programmable, a defective normal memory cell may be replaced with a redundant memory cell the memory is packaged.

14 Claims, 2 Drawing Sheets

SEMICONDUCTOR MEMORY HAVING REDUNDANCY CIRCUIT

BACKGROUND OF THE INVENTION

This invention relates generally to semiconductor memories and more particularly to semiconductor memories having redundancy circuits.

As is known in the art, semiconductor memories include an array of memory cells arranged in a matrix of rows and columns, a row address decoder for selectively addressing one of the rows of memory cells, and a column address decoder for selecting one of the columns of memory cells. As semiconductor memories become more highly integrated, the number of defective cells on a chip correspondingly increases. These defects are typically detected during burn-in. Today, high density memories include redundant memory cells. More particularly, the row and column address decoders have redundant circuitry adapted to decouple the defective cells and effectively replace them with the redundant cells fabricated on the chip. One technique used to decouple the defective cells and replace them with the redundant cells is through the use of fusible links. After burn-in, and before packaging, if a memory cell is found defective, a laser is used to evaporate a portion of the fusible link and thereby create an open circuit. After the laser has open circuited the appropriate fusible links, the chip is packaged and the memory retested. In some cases, the packaging process itself causes defects to be produced thereby destroying the usefulness of the packaged memory.

SUMMARY OF THE INVENTION

In accordance with the present invention, a memory is provided having an array of memory cells. The array includes a plurality of normal memory cells and a redundant memory cell. A decoder is provided for selecting an addressed one of the normal memory cells in response to an address and a normal condition signal and is adapted to address the redundant memory cell in response to the address and a fault condition signal. A redundant decoder is provided having an electronically erasable read-only-memory cell. The redundant decoder is adapted to produce the normal condition signal and to convert the normal condition signal into the fault condition signal when such read-only-memory cell is programmed into a fault condition.

Each one of the read-only memory cells include a flash memory cell, a ferroelectric memory cell, or other such type of electronically erasable read-only memory cell which is substantially non-volatile and is able to retain its programmed state for a relatively long period of time. With such an arrangement, because the electronically erasable read-only-memory cell is electronically programmable, a defective normal memory cell may be replaced with a redundant memory cell after the memory is packaged.

In accordance with another feature of the invention, a memory is provided having an array of memory cells. The array comprises a plurality of rows and columns of normal memory cells and a row and a column of redundant memory cells. A row decoder is provided for selecting an addressed one of the rows of normal memory cells in response to a row address and a normal row condition signal and is adapted to address the row of redundant memory cells in response to the row address and a row fault condition signal. A column decoder is provided for selecting an addressed one of the columns of normal memory cells in response to a column address and a normal column condition signal and is adapted to address the column of redundant memory cells in response to the column address and a column fault condition signal. A redundant row decoder has a first plurality of electronically erasable read-only-memory cells. The redundant row decoder is adapted to produce the normal row condition signal and to convert the normal row condition signal into the row fault condition signal when selected ones of the first plurality of read-only-memory cells are programmed into a row fault condition. The selected ones of the first plurality of read-only memory cells are programmed into the row fault condition corresponding to one of the normal rows of memory cells having a defective condition. A redundant column decoder has a second plurality of electronically erasable read-only-memory cells. The redundant column decoder is adapted to produce the normal column condition signal and to convert the normal column condition signal into the column fault condition signal when selected ones of the second plurality of read-only-memory cells are programmed into a column fault condition. The selected ones of the second plurality of read-only memory cells are programmed into the column fault condition corresponding to one of the normal column of memory cells having a defective condition.

In one embodiment of the invention, the memory cells in the array are dynamic random access memory cells, i.e., DRAM cells. Each one of the read-only memory cells includes a transistor having source, drain and gate regions formed in the same semiconductor body as the DRAM cells. A first insulating layer is disposed over the gate region. A first, floating gate is disposed over the first insulating layer. A second insulating layer is disposed over the first, floating gate. And, a second gate disposed over the second insulating layer. The read-only memory cell is placed in programmed in accordance with charge store in the floating gate.

BRIEF DESCRIPTION OF THE DRAWING

Other features of the invention, as well as the invention itself, will become more readily apparent from the following detailed description when taken together from the following drawings, in which.

DESCRIPTION OF THE PREFERRED EMBODIMENTS

Figure 1:
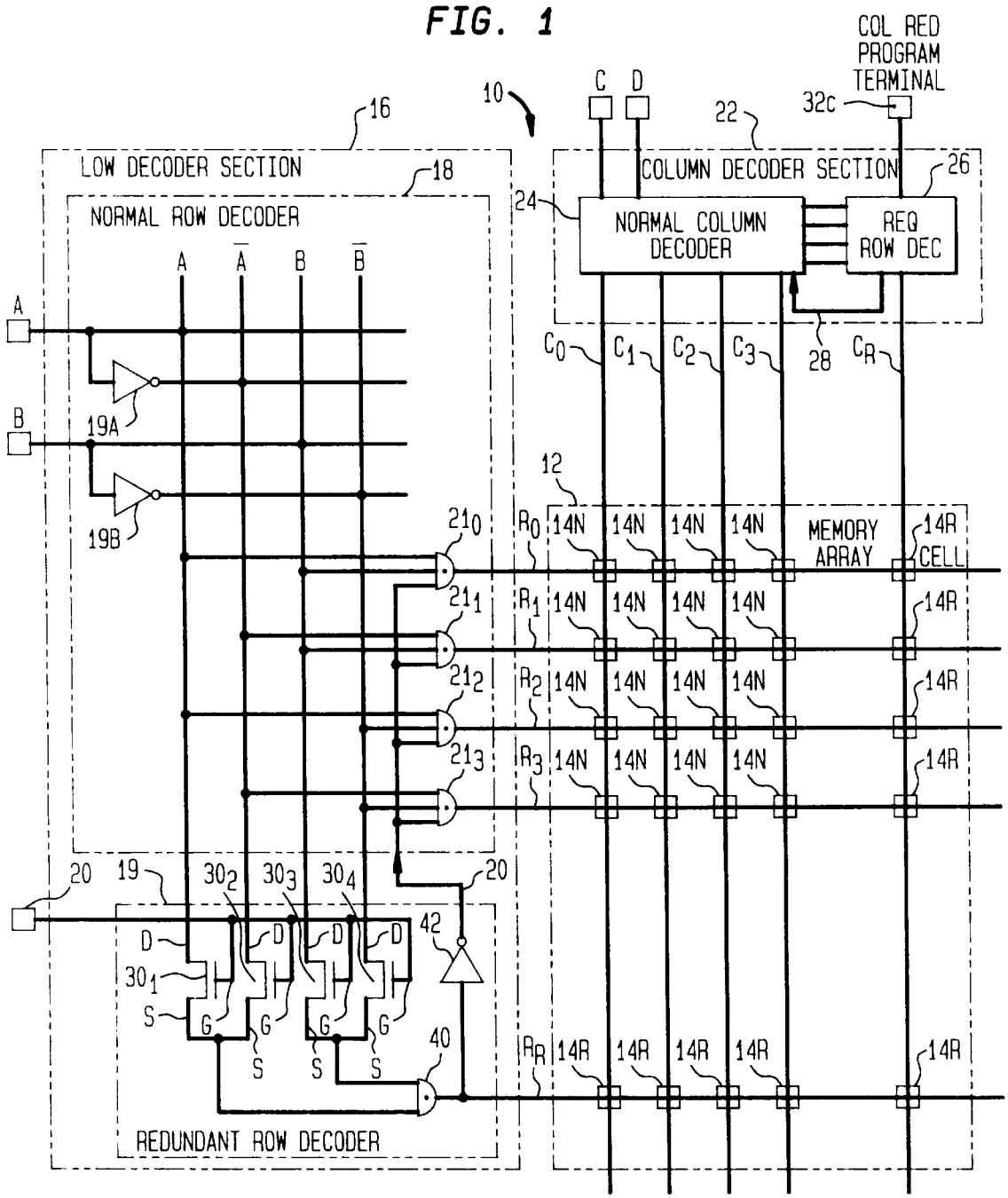
FIG. 1 is a simplified schematic diagram of a memory according to the invention.

Referring now to FIG. 1, a memory 10 is shown having an array 12 of memory cells 14N, 14R. The memory 10, for example, is a random access memory (RAM) ciruit, a dynamic RAM (DRAM) circuit, a synchronous DRAM (SDRAM) circuit, a static RAM (SRAM) circuit, or a merged DRAM-logic circuit, or any circuit device. More particularly, the array 10 comprises a plurality of rows and columns of normal memory cells 14N and a row and a column of redundant memory cells 14R. Here, for simplicity in understanding the memory 10 only four rows, $R_0$–$R_3$ are shown, and four columns $C_0$–$C_3$, it being understood that in a typical memory there would be 16, 32 or more such rows and columns.

A row decoder section 16 is provided. The row decoder section 16 includes a normal row decoder 18 and a redundant row decoder 19. The normal row decoder 18 is adapted to select an addressed one of the rows $R_0$–$R_3$ of normal memory cells 14N in response to a row address, here a two bit address A, B when a normal row condition signal is produced on line 20 by the redundant decoder 19 in a manner to be described. Suffice it to say here that, after packaging of the memory, if a normal memory cell 14N is found to be defective during a post-package test of the memory 10, the redundant row decoder 19 of decoder 16 is programmed to address the row $R_N$ of redundant memory cells 14R in response to the row address A, B in place of the row $R_0$–$R_3$ having the defective normal memory cell 14N, in a manner to be described.

Thus, the normal row decoder 18 includes a plurality of AND gates $21_0$–$21_3$ each one having an output coupled to a corresponding one of the rows $R_0$–$R_3$ of normal memory cells 14N respectively, as shown. The row decoder 18 includes a pair of inverters 19A, 19B each one coupled to one of the address bits, A and B, respectively as shown, to produce complements of the address bit, i.e., $\overline{A},\overline{B}$, respectively. Each of the AND gates $21_0$–$21_3$ is fed the signal on line 20 and, in addition, the following signals: $\overline{A}, \overline{B}; A, \overline{B}; \overline{A},B$; and A,B, respectively as shown. Thus, and assuming the signal on line 20 is logic 1, if the bits on lines A and B are 00, the output of AND gate $21_0$ is logic 1 (i.e., in the normal row condition) and the output of each one of the AND gates $21_1$–$21_3$ is a logic 0. Therefore, in response to an row address on AB of 00, only row $R_0$ is selected. In like manner, addresses AB of 01, 10, and 11 will select rows $R_1$, $R_2$, and $R_3$, respectively. It is noted that if the logic signal on line 20 is logic 0 (i.e., in the fault row condition), none of the rows $R_0$–$R_3$ will be selected.

The redundant row decoder 19 has a first plurality of, here four, electronically erasable read-only-memory cells $30_1$–$30_4$. The redundant row decoder 19 is adapted to produce the normal row condition signal on line 20 during a post-packaging test mode. If after the memory 10 is packaged and a post-packaged test of the memory detects memory normal memory cells 14N in one of the rows $R_0$–$R_3$ is defective, the redundant row decoder 19 is placed in a programmed condition by a signal on row redundant program terminal 32R. In response to the signal on terminal 32R and to the address of the one of the rows $R_0$–$R_3$ having the defective normal cell 14N, a pair of the read-only memory cells $30_1$–$30_4$ selected by the address are programmed into a conducting condition and the redundant decoder 19 thereby converts the normal row condition signal on line 30 (i.e., logic 1) into the row fault condition signal (logic 0). That is, when, after the post-test a row of normal memory cells 14N is found defective, selected ones of the first plurality of read-only-memory cells are programmed into a row fault condition. The selected ones of the first plurality of read-only memory cells $30_1$–$30_4$ are programmed into the row fault condition corresponding to one of the normal rows $R_0$–$R_3$ of memory cells 14N having a defective condition.

Figure 2:
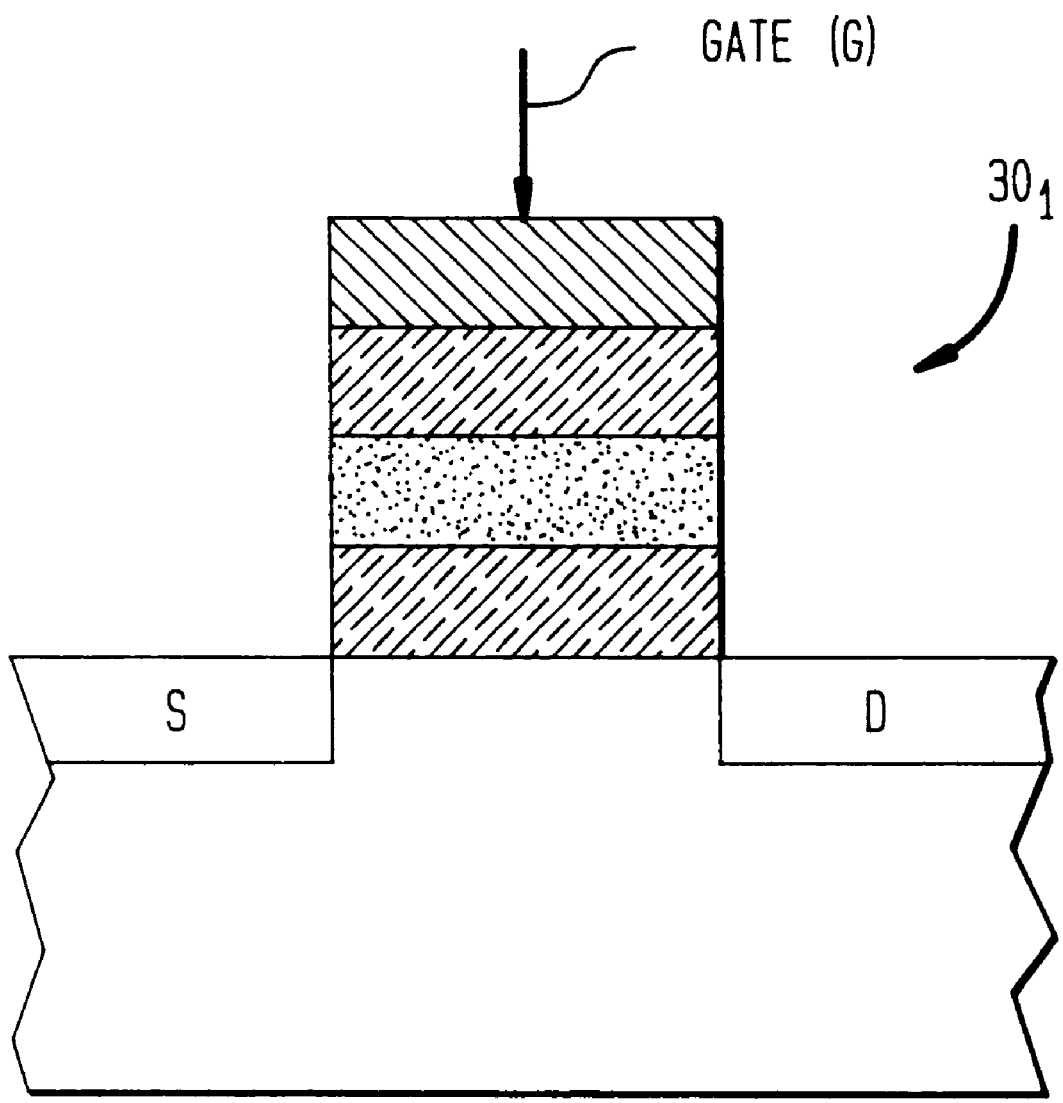
FIG. 2 is a sketch of an electronically erasable read-only-memory cells used in the memory of FIG. 1.

For example, consider that the read-only memory cells $30_1$–$30_4$ are each a flash memory cell, an exemplary one thereof, here cell $30_1$ being shown in FIG. 2. Such cell $30_1$ includes a semiconductor body having formed therein a source region S, a drain region D and a gate region disposed between such source and drain regions. The gate region has an insulating layer formed on the surface thereof. A doped polycrystalline layer is formed on the insulating layer to provide a floating gate for the cell. A second insulating layer is disposed on the floating gate. A gate electrode is disposed on the second insulating layer. It should be noted that the semiconductor body also has formed therein the DRAM cells 41N and 14R. Thus, here the read-only memory cell is placed in a non-conducting condition by removing any charge which may be in the floating gate, as by exposing the gate to ultra-violet light, and is programmed to a conducting condition by tunnelling charge into the floating gate, as be creating a potential between the source and gate electrode.

Referring again to FIG. 1, it is noted that the gate electrodes of the cells $30_1$–$30_4$ are connected to the row redundancy program terminal 32R. The drain regions D of cells $30_1$–$30_4$ are connected to the signals on lines A, B,$\overline{A}$, $\overline{B}$, respectively, as shown. The source regions S of cells $30_1$ and $30_2$ are connected together and to a first input of AND gate 40. The source regions S of cells $30_3$ and $30_4$ are connected together and to a second input of AND gate 40. The output of AND gate 40 is fed to line 20 through inverter 42. Thus, after the post-package test, with a voltage applied to the row redundancy program terminal 32R and with the address of the defective row, here in this example row $R_1$ applied to the row address AB, i.e., A=0, B=1, cells $30_2$ and $30_3$ become programmed i.e., charge is tunnelled into the floating gates thereof, resulting in such cells $30_2$ and $30_3$ being placed in a conducting condition. Thus, the redundant row RR is selected when an AB address of 01 is applied to the row decoder section 16 in place of row $R_1$ because inverter 42 produces a logic 0 on line 20 when the AND gate 40 produces a logic 1.

A column decoder section 22 is provided. The column decoder section 22 is equivalent to the row decoder section 16, includes a normal column decoder 24 and a redundant column decoder section 26. The normal column decoder section 24 is adapted to select an addressed one of the columns $C_0$–$C_4$ of normal memory cells 14N in response to a column address, here a two bit address C, D and a normal row condition signal produced on line 28 by the redundant decoder 26 in a manner to be described. Suffice it to say here that, after packaging of the memory, if a normal memory cell 14N is found to be defective during a post-package test of the memory 10, the redundant column decoder 24 of decoder section 22 is adapted to address the column $C_N$ of redundant memory cells 14R in response to the column address C, D and a column fault condition signal produced on line 28 in place of the column $C_0$–$C_3$ having the defective normal memory cell 14N, in a manner to be described. Thus, and assuming the signal on line 28 is logic 1, addresses CD of 00, 01, 10, and 11 will select columns $C_0$, $C_1$, $C_2$, and $C_3$, respectively. It is noted that if the logic signal on line 28 is logic 0, none of the columns $C_0$–$C_3$ will be selected.

The redundant column decoder 22 is equivalent to the redundant column decoder 19 and has a second plurality of electronically erasable read-only-memory cells, not shown. The redundant column decoder 22 is adapted to produce the normal column condition signal on line 28 and to convert the normal column condition signal on line 28 into the column fault condition signal when selected ones of the second plurality of read-only-memory cells, not shown, are programmed into a column fault condition in response to a redundant column program signal on redundant column program terminal 32C. The selected ones of the second plurality of read-only memory cells are programmed into the column fault condition corresponding to one of the normal column of memory cells having a defective condition.

Other embodiments are within the spirit and scope of the appended claims.

What is claimed is:

1. A memory, comprising:

an array of memory cells, such array comprising a plurality of normal memory cells and a redundant memory cell;

a normal decoder, for selecting an addressed one of the normal memory cells in response to an address provided on an address bus and to a normal condition signal and adapted to be disabled from selecting such addressed one of the normal memory cells in response to and a fault condition signal;

a redundant decoder having an electronically erasable read-only-memory cell, such redundant decoder being adapted to produce the normal condition signal and to convert the normal condition signal into the fault condition signal when such read-only-memory cell is programmed into a fault condition; and wherein the address bus provides the address as a common address for both the normal decoder and the redundant decoder.

2. A memory, comprising:

an array of memory cells, such array comprising a plurality of rows of normal memory cells and a row of redundant memory cells;

a normal decoder, for selecting an addressed one of the rows of normal memory cells in response to an address provided on an address bus and to a normal condition signal and adapted to be disabled from selecting such addressed one of the normal memory cells in response to a fault condition signal;

a redundant decoder having a plurality of electronically erasable read-only-memory cells, such redundant decoder being adapted to produce the normal condition signal and to convert the normal condition signal into the fault condition signal when selected ones of the read-only-memory cells are programmed into a fault condition, the selected ones of the read-only memory cells programmed into the fault condition corresponding to one of the normal rows of memory cells having a defective condition and wherein the address bus provides the address as a common address for both the normal decoder and the redundant decoder.

3. A memory, comprising:

an array of memory cells, such array comprising a plurality of rows and columns of normal memory cells and a row and a column of redundant memory cells;

a normal row decoder, for selecting an addressed one of the rows of normal memory cells in response to a row address provided on a row address bus and to a normal row condition signal and adapted to be disabled from selecting such addressed one of the row of normal memory cells in response to a row fault condition signal;

a normal column decoder, for selecting an addressed one of the columns of normal memory cells in response to a column address provided on a column address bus and to a normal column condition signal and adapted to be disabled from selecting such addressed one of the column of memory address cells in response to a column fault condition signal;

a redundant row decoder having a first plurality of electronically erasable read-only-memory cells, such redundant row decoder being adapted to produce the normal row condition signal and to convert the normal row condition signal into the row fault condition signal when selected ones of the first plurality of read-only-memory cells are programmed into a row fault condition, the selected ones of the first plurality of read-only memory cells programmed into the row fault condition corresponding to one of the normal rows of memory cells having a defective condition; and wherein the row address bus provides the row address as a common row address for both the normal row decoder and the redundant row decoder;

a redundant column decoder having a second plurality of electronically erasable read-only-memory cells, such redundant column decoder being adapted to produce the normal column condition signal and to convert the normal column condition signal into the column fault condition signal when selected ones of the second plurality of read-only-memory cells are programmed into a column fault condition, the selected ones of the second plurality of read-only memory cells programmed into the column fault condition corresponding to one of the normal column of memory cells having a defective condition; and wherein the column address bus provides the column address as a common column address for both the normal column decoder and the redundant column decoder.

4. The memory recited in claim 3 wherein each one of the first and second pluralities of read-only memory cells includes a flash memory cell.

5. The memory recited in claim 3 wherein each one of the first and second pluralities of read-only memory cells includes a ferroelectric memory cell.

6. The memory recited in claim 3 wherein each one of the read-only memory cells includes a transistor having source, drain and gate regions formed in a semiconductor body; an first insulating layer disposed over the gate region; a first, floating gate disposed over the first insulating layer; a second insulating layer disposed over the first insulating layer and first floating gate; and a second gate disposed over the second insulating layer.

7. The memory recited in claim 6 wherein the first gate comprises doped polycrystalline silicon.

8. A memory, comprising:

an array of memory cells, such array comprising a plurality of normal memory cells and a redundant memory cell;

a normal decoder for selecting an addressed one of the normal memory cells in response to an address signal;

a redundant decoder having an electronically erasable read-only-memory cell, such redundant decoder being adapted to program such read-only-memory cell in response to a redundant program signal and to enable the programmed cell to address the redundant cell in response to the address signal; and an address bus for providing the address as a common address to both the normal decoder and to the redundant decoder.

9. A memory, comprising:

an array of memory cells, such array comprising a plurality of rows of normal memory cells and a row of redundant memory cells;

a normal decoder, for selecting an addressed one of the rows of normal memory cells in response to an address signal during a normal condition signal and being inhibited from selecting the addressed one of the rows of memory cells in the absence of such normal condition signal;

a redundant decoder having a plurality of electronically erasable read-only-memory cells, such redundant decoder being adapted to program selected ones of the read-only memory cells in response to a redundant program signal, such read-only-memory cells being selected in accordance with the address signal, such programmed read-only-memory cells being adapted to address the row of redundant memory cells and remove the normal condition signal from the normal decoder; and an address bus for providing the address as a common address to both the normal decoder and to the redundant decoder.

10. A memory, comprising:

an array of memory cells, such array comprising a plurality of rows and columns of normal memory cells and a row and a column of redundant memory cells;

a normal row decoder, for selecting an addressed one of the rows of normal memory cells in response to a row address signal and a normal row condition signal and being inhibited from selecting the addressed one of the rows of memory cells in the absence of such normal condition signal;

a normal column decoder, for selecting an addressed one of the columns of normal memory cells in response to a column address signal and a normal column condition signal and being inhibited from selecting the addressed one of the columns of memory cells in the absence of such normal condition signal;

a redundant row decoder having a first plurality of electronically erasable read-only-memory cells, such redundant row decoder being adapted to produce the normal row condition signal and to remove the normal row condition signal when selected ones of the first plurality of read-only-memory cells are programmed in response to a row redundant program signal, such first plurality of read-only-memory cells being selected in accordance with the row address signal, such programmed ones of the first plurality of read-only-memory cells being adapted to address the row of redundant memory cells; and a redundant column decoder having a second plurality of electronically erasable read-only-memory cells, such redundant column decoder being adapted to produce the normal column condition signal and to remove the normal column condition signal when selected ones of the second plurality of read-only-memory cells are programmed in response to a column redundant signal, the second plurality of read-only memory cells being selected in accordance with the column address signal, such programmed ones of the second plurality of read-only-memory cells being adapted to address the row of redundant memory cells;

a row address bus for providing the row address as a common row address for both the normal row decoder and the redundant row decoder;

a column address bus for providing the column address as a common column address for both the normal column decoder and the redundant column decoder.

11. The memory recited in claim 10 wherein each one of the first and second pluralities of read-only memory cells includes a flash memory cell.

12. The memory recited in claim 10 wherein each one of the first and second pluralities of read-only memory cells includes a ferroelectric memory cell.

13. The memory recited in claim 10 wherein each one of the read-only memory cells includes a transistor having source, drain and gate regions formed in a semiconductor body; a first insulating layer disposed over the gate region; a first, floating gate disposed over the first insulating layer; a second insulating layer disposed over the first, floating gate; and a second gate disposed over the second insulating layer.

14. The memory recited in claim 13 wherein the first gate comprises doped polycrystalline silicon.

* * * * *